United States Patent [19]
Wise

[11] Patent Number: 5,907,774
[45] Date of Patent: May 25, 1999

[54] CORRUGATED POST CAPACITOR AND METHOD OF FABRICATING USING SELECTIVE SILICON DEPOSITION

[75] Inventor: Rick L. Wise, Plano, Tex.

[73] Assignee: Texas Instruments Incorporated, Dallas, Tex.

[21] Appl. No.: 08/865,445

[22] Filed: May 29, 1997

[51] Int. Cl.⁶ .............................................. H01L 21/8242
[52] U.S. Cl. ........................ 438/254; 438/255; 438/256
[58] Field of Search .................................... 438/239, 238, 438/253–256, 381, 396–399

[56] References Cited

U.S. PATENT DOCUMENTS

| | | | |
|---|---|---|---|
| 5,080,933 | 1/1992 | Grupen-Shemansky et al. ... | 427/255.1 |
| 5,240,871 | 8/1993 | Doan et al. .............................. | 438/238 |
| 5,384,276 | 1/1995 | Ogawa et al. ........................... | 438/238 |
| 5,716,884 | 2/1998 | Hsue et al. .............................. | 438/238 |

FOREIGN PATENT DOCUMENTS

| | | | |
|---|---|---|---|
| 0 427 200 | 5/1991 | European Pat. Off. ...... | H01L 27/108 |
| 0 448 374 A1 | 9/1991 | European Pat. Off. ........ | H01L 29/94 |
| 42 29 363 | 3/1993 | Germany ...................... | H01L 21/70 |

*Primary Examiner*—Joni Chang
*Attorney, Agent, or Firm*—Jacqueline J. Garner; W. James Brady, III; Richard L. Donaldson

[57] ABSTRACT

A dynamic random access memory cell (20) with increased capacitance and a method of fabricating the cell, including forming a corrugated post capacitor (21) is provided. The method includes depositing a first film (80) having a first etched selectivity and depositing on the first film a second film (82) having a second etched selectivity. These steps of depositing a first film and a second film are repeated at least once to form a plurality of first film layers (80) alternated with a plurality of second film layers (82). A void (58) is etched in the plurality of first and second film layers. The plurality of first and second layers are selectively etched to form a plurality of undercut areas. Silicon is then selectively deposited in the void, and by overgrowing the selectively deposited silicon a portion of the undercut areas is filled with silicon to form a corrugated post storage electrode. The pluralities of first (80) and second (82) film layers are then removed. A layer of rugged polysilicon may be applied to further enhance the surface area of the storage electrode. A capacitor dielectric (48) is then formed over the selectively deposited silicon and a conductive material (50) is formed over the dielectric.

14 Claims, 6 Drawing Sheets

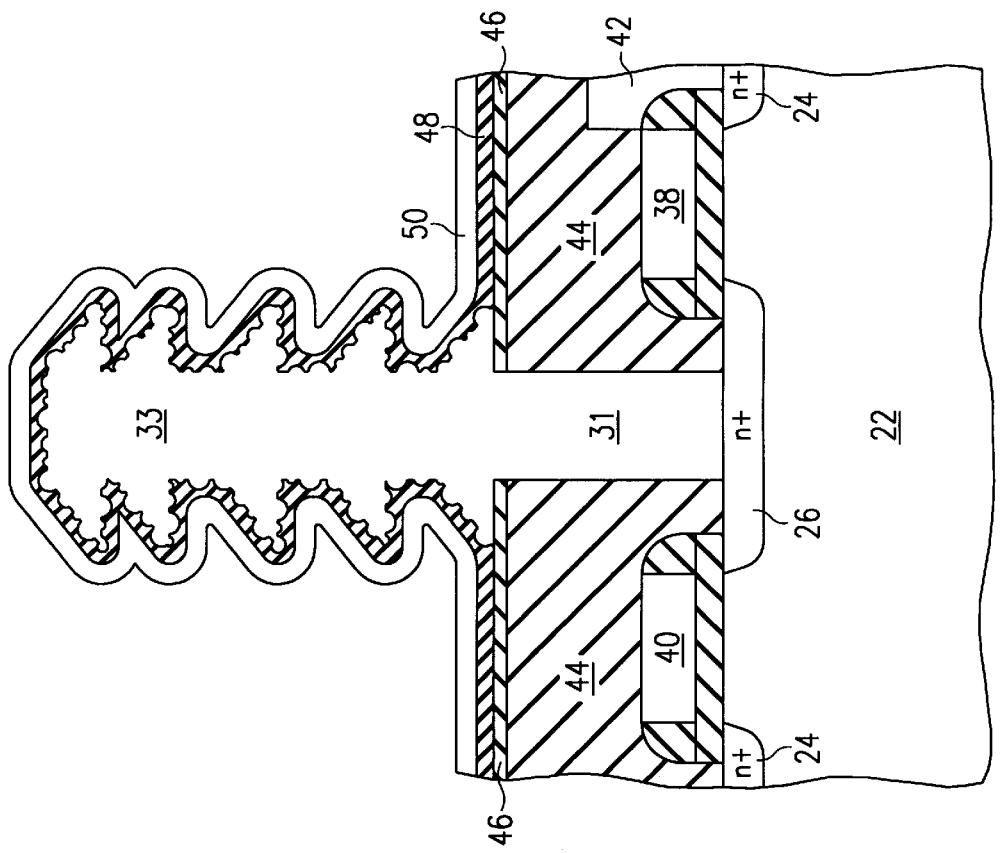
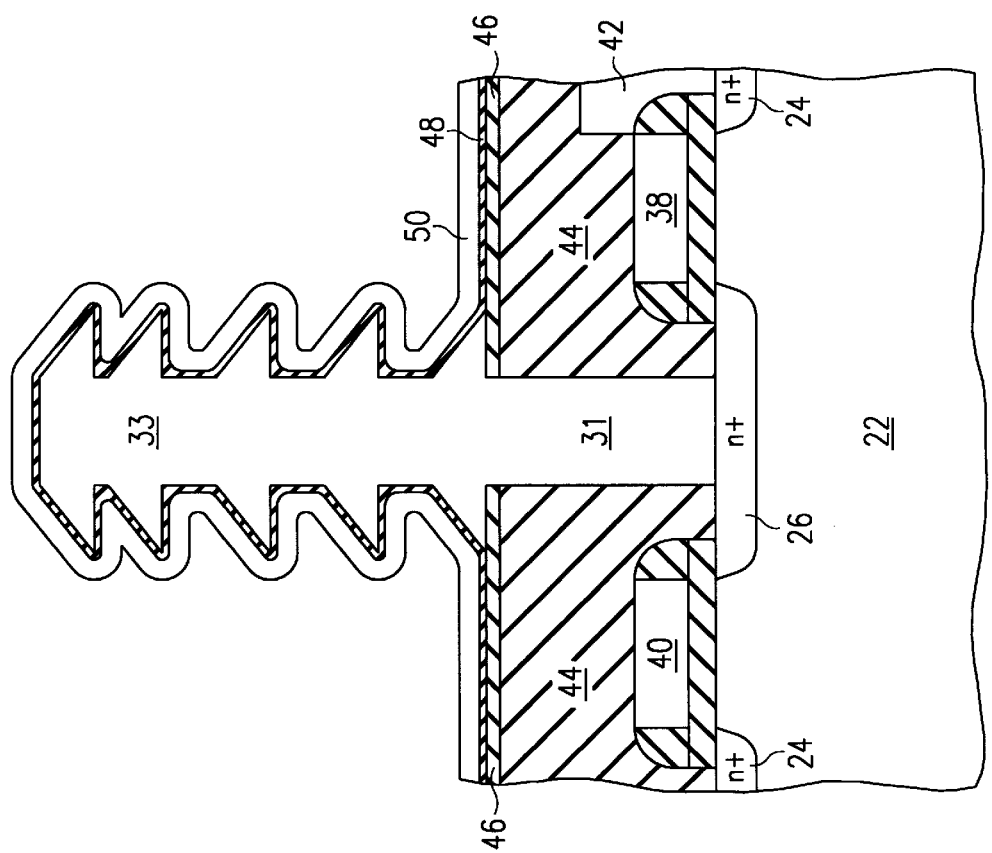

CORRUGATED POST CAPACITOR AND METHOD OF FABRICATING USING SELECTIVE SILICON DEPOSITION

RELATED APPLICATIONS

This application is related to the following co-assigned patent applications, which are incorporated herein by reference. Those applications are Corrugated Crown Capacitor for High Density Memory Applications, filing date May 29, 1997, U.S. Ser. No. 08/865,486 (TI-19464) and Dynamic Random Access Memory with Increased Capacitance and Method of Fabricating Using Selective Silicon Deposition, filing date May 29, 1997, U.S. Ser. No. 08/865,363 (TI-19534).

TECHNICAL FIELD OF THE INVENTION

This invention relates generally to integrated circuit processing, and more particularly to a method of fabricating a dynamic random access memory with increased capacitance.

BACKGROUND OF THE INVENTION

Dynamic random access memory ("DRAM") cells typically consist of one transistor and one capacitor. One of the goals in the design of DRAMs is to increase the memory capacity of each integrated circuit. To increase the memory capacity, significant efforts have been made at decreasing the size of each of the memory cells that make up the DRAM. One of the most challenging problems faced by DRAM designers is the maintenance of sufficient charge-storage capacity in the capacitors of the memory cells as their size is decreased.

Important parameters involved in increasing the charge stored on the capacitor are typically the dielectric constant, thickness of the insulator, and surface area of the capacitor. Many techniques have been investigated for increasing the charge-storage capacity in capacitors without increasing the area (footprint) the DRAM cells occupy on a chip's surface or the size (volume) of the DRAM cell. One example is a trench capacitor in which the capacitor is formed as part of a trench formed in a substrate with the transistor disposed on the surface of the substrate. A trench capacitor may include a plate electrode of the capacitor inside the trench and a storage electrode on the substrate.

Another approach that allows a memory cell to shrink in size without a loss of its storage capacity is stacking the storage capacitor on top of the associated transistor. DRAM cells made through this process are sometimes called stacked capacitor DRAMs. Although stack capacitor DRAMs may reduce the planar surface area required by a capacitor, they are generally formed significantly above the surface of the substrate in which the DRAM cell is formed, which leads to topological problems in the formation of subsequent layers of the associated integrated circuit.

SUMMARY OF THE INVENTION

Therefore, a need has arisen for a method of fabricating a DRAM cell that reduces the problems associated with previous capacitor structures, while maintaining sufficient storage capacity for the capacitor.

According to the teachings of the present invention a method for forming a dynamic random access memory cell having a storage capacitor is provided. That method includes: depositing a first film having a first etch selectivity and depositing on the first film a second film having a second etch selectivity. The steps of depositing the first and second films are repeated at least one time to form a plurality of first film layers alternated with a plurality of second film layers. A void is then patterned and etched the pluralities of first and second film layers through selective etching of the plurality of first and second film layers, a plurality of undercut areas is formed. Silicon is then selectively deposited in the void. By overgrowing the selectively deposited silicon, to a portion of the undercut areas is filled with silicon to create a corrugated section. After removing the pluralities of first and second film layers a capacitor dielectric is formed over the selectively deposited silicon. A conductive material is the deposited over the dielectric.

According to another embodiment of the present invention, a method for performing a capacitor for a semiconductor device having a substrate is provided. The method includes forming on the substrate an insulating layer and a mask layer over the insulating layer. Then a plurality of alternating layers of first and second materials are deposited on the mask layer. The first and second materials have different etched selectivities in a ratio of at least 20:1. The plurality of alternating layers are patterned to expose a first area. Then the plurality of alternating layers are etched beneath the first area to expose the masking layer and to create a first void region. The masking layer and the insulating layer are then patterned to expose a second area, under which the insulating layer is anisotropically etched to create a second void region and expose the substrate. The plurality of alternating layers are then selectively and radially etched to form a plurality of undercut areas. Silicon is then selectively deposited in the first and second void regions and the undercut areas. After selective deposition of silicon, the plurality of alternating areas are removed. Finally, a dielectric layer is formed over the selectively deposited silicon, and a conductive material is formed over the dielectric layer.

In another embodiment, a dynamic random access memory cell having a storage capacitor disposed on a surface of a substrate. The storage capacitor includes a corrugated post storage electrode with a dielectric material deposited over the corrugated post storage electrode and a conductive material deposited over the dielectric material.

Important technical advantages of the present invention include significantly increasing the storage capacity of a storage electrode in a capacitor type DRAM cell by increasing the surface area of the storage electrode. By increasing the surface area the amount of charge that can be stored by the associated capacitor is increased without increasing the overall size of the DRAM cell or the footprint on the associated substrate. Thus, DRAM cells can further shrink in size while maintaining a sufficient amount of capacitance.

BRIEF DESCRIPTION OF THE DRAWINGS

For a more complete understanding of the present invention, and the advantages thereof, reference is now made to the following descriptions taken in conjunction with the accompanying drawings, in which:

FIG. 8 is a drawing in section with portions broken away showing the corrugated storage capacitor after applying a dielectric layer and a polysilicon layer; and FIG. 9 is a drawing in section with portion broken away showing the corrugated storage capacitor after applying a layer of rugged polysilicon, a dielectric layer, and a polysilicon layer.

DETAILED DESCRIPTION OF THE INVENTION

The preferred embodiments of the present invention and its advantages are best understood by referring to FIGS. 1–9 of the drawings, like numerals being used for like and corresponding parts of the various drawings.

Figure 1:
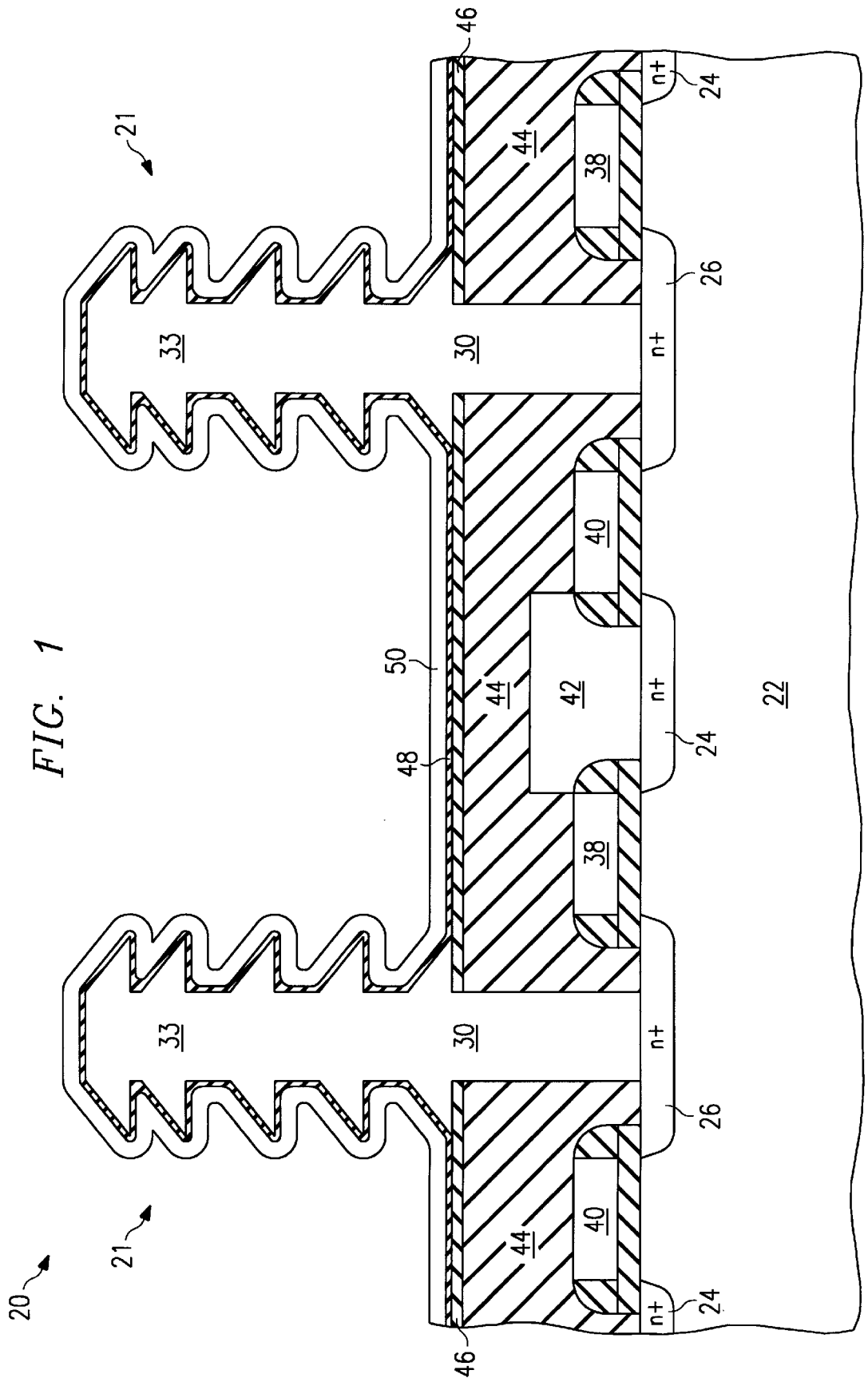
FIG. 1 is a schematic drawing in section with portions broken away of a DRAM cell fabricated according to the teachings of the present invention on a semiconductor substrate.

FIG. 1 shows two dynamic random access memory (DRAM) cells 20 disposed on semiconductor substrate 22 constructed according to the teachings of the present invention. Semiconductor substrate 22 is typically a p-type silicon substrate, although it should be understood that other substrates may be used without departing from the scope of the invention. Memory cells 20 are preferably dynamic random access memory cells. However, the present invention may be used to form a wide variety of memory cells and other electronic devices that require a relatively large amount of capacitance in a relatively small total volume. Doped source regions 24 and doped drain regions 26 are shown in FIG. 1. With a p-type substrate, source regions 24 and drain regions 26 are typically doped with n-type impurities.

A corrugated post storage capacitor 21 extends from drain region 26 and includes corrugated post storage electrode 30, dielectric 48, and a second electrode 50.

The corrugated post storage electrode 30 may be patterned to form separate corrugated post storage electrodes for multiple memory cells. The storage electrode 30, may be formed of doped silicon, which may be doped polysilicon, and conductively coupled to the drain region 26 as shown in FIG. 1. Corrugated post storage electrode 30 includes a corrugated portion 33. The corrugated portion 33 allows for enhanced surface area contact between the corrugated post storage electrode 30 and the dielectric 48, thereby increasing the memory capacity of the storage electrode 30 and therefore the capacity of storage capacitor 21. Dielectric material 48 is formed on the exterior of corrugated post storage electrode 30, and may extend to the corrugated post storage electrode in an adjacent memory cell. Corrugated post storage electrode 30 may be made of doped polysilicon and may have a doping level somewhere in the region of $1–5\times10^{20}$ atoms/cm$^3$ of phosphorous. However, other doping levels and dopants may be used without departing from the teachings of the present invention. Second electrode 50 is formed on the exterior of dielectric material 48 and may extend to the storage capacitor in an adjacent memory cell.

The memory cell 20 also includes an insulating layer 44, such as an oxide, and a masking layer 46, such as a nitride. Insulating layer 44 and making layer 46 facilitate formation of storage capacitor 21 as described in more detail in connection with FIGS. 2–9.

Although the present invention is described in the context of a DRAM shown in FIG. 1, it should be understood that various modifications, alterations, and substitutions can be made without departing from the intended scope of the present invention.

Figure 2:
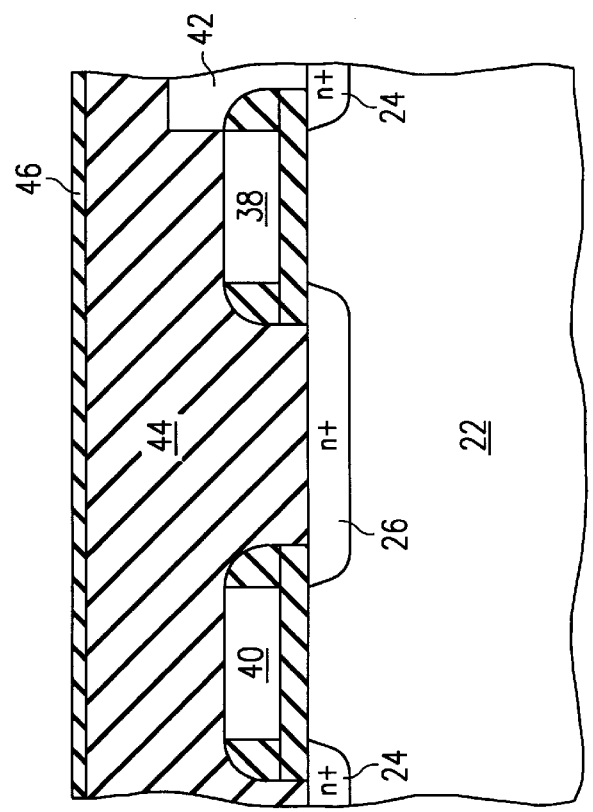
FIG. 2 is a schematic drawing in section with portions broken away of a DRAM storage capacitor, during formation of a first oxide layer and a first nitride layer.

One method of fabrication of the memory cell 20, including corrugated post storage capacitor 21, is described below in conjunction with FIGS. 2–9. FIG. 2 illustrates a step in one method of the fabrication of the corrugated post storage capacitor 21 shown in FIG. 1 according to the teachings of the present invention. After formation of sources 24, drains 26, gates 38 and 40, and bitline 42, which may constructed according to teachings well known in the art, an insulating layer 44, such as oxide, is placed over these elements. In addition, a masking layer 46, such as nitride, is placed over insulating layer 44. An enlarged view of the masking layer 46 and insulating layer 44 overlying drain region 26 is shown in FIG. 2.

Figure 3:
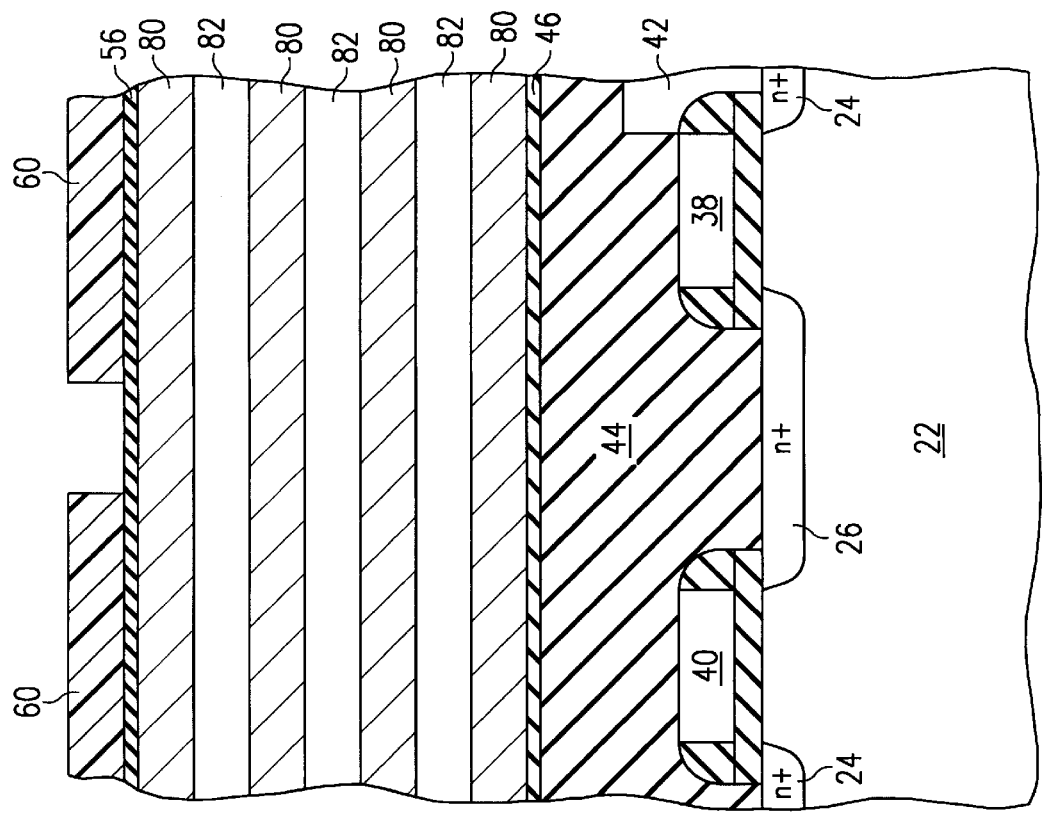
FIG. 3 is a schematic drawing in section with portions broken away of a DRAM storage capacitor, during formation of a plurality of alternating layers of doped and undoped material.

As illustrated in FIG. 3, alternating layers 80 and 82 of first 80 and second 82 material are deposited, as shown in FIG. 3. Overlying the alternating layers 80, 82 is a masking layer 56, such as nitride. The first and second materials have different selectivities in a etch process and preferably have vastly different selectivities. Etch selectivities in the ratio of 20:1 may be used. For example, the first material layers 80 could comprise TEOS (tetra ethoxysilane) and the second material layers 82 could comprise an SACVD (subatmospheric chemical-vapor deposition) oxide or PSG (phosphosilicate glass). Various combinations of first and second materials will be apparent to those skilled in the art. For example, combinations of doped and undoped oxides or hard and soft oxides could be used. The first 80 and second 82 materials presumably are capable of being etched selectively with respect to polysilicon. An etch selectivity ratio on the order of 20 to 1 or greater is desirable.

The thickness of alternating layers 80 and 82 may be on the order of 200 to 500 Å. Although shown as having the same thickness, it should be noted that layers 80 and 82 need not be of the same thickness. The thickness is a design variable chosen on the basis of, for example, desired surface area and the area required for the subsequent steps of forming the capacitor dielectric 48 in the second node 50 of the storage capacitor 21. The number of alternating layers 80, 82 may also vary depending on the surface area desired and the mechanical stability/reliability of the resulting structure.

Figure 4:
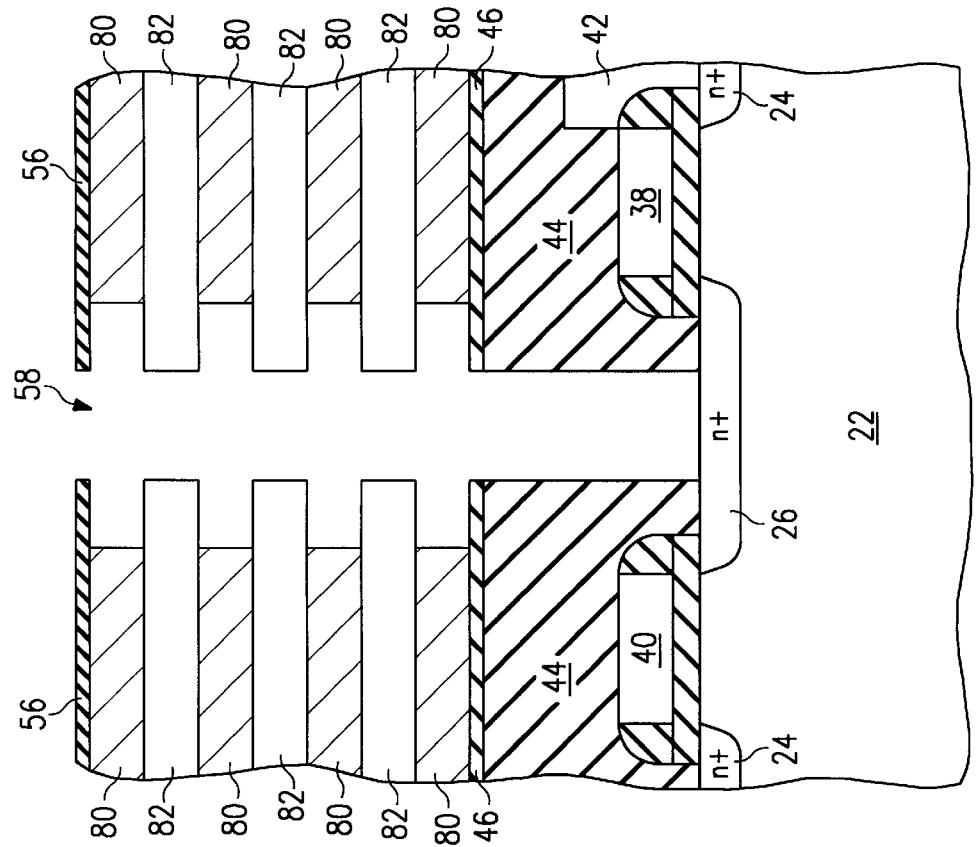
FIG. 4 is a schematic drawing in section with portions broken away showing a DRAM storage capacitor showing formation of a storage capacitor, after etching a void in the oxide and nitride layers and the alternating layers of doped and undoped material.

As shown in FIGS. 3 and 4, through techniques well known in the art, such as using a mask 60, a pattern is formed in masking layer 56 and a void region is created in the alternating layers 80, 82 through an anisotropic etch. The same pattern is formed in mask layer 46 and a void region 58 is extended through insulating layer 44 to the drain region 26.

Figure 5:
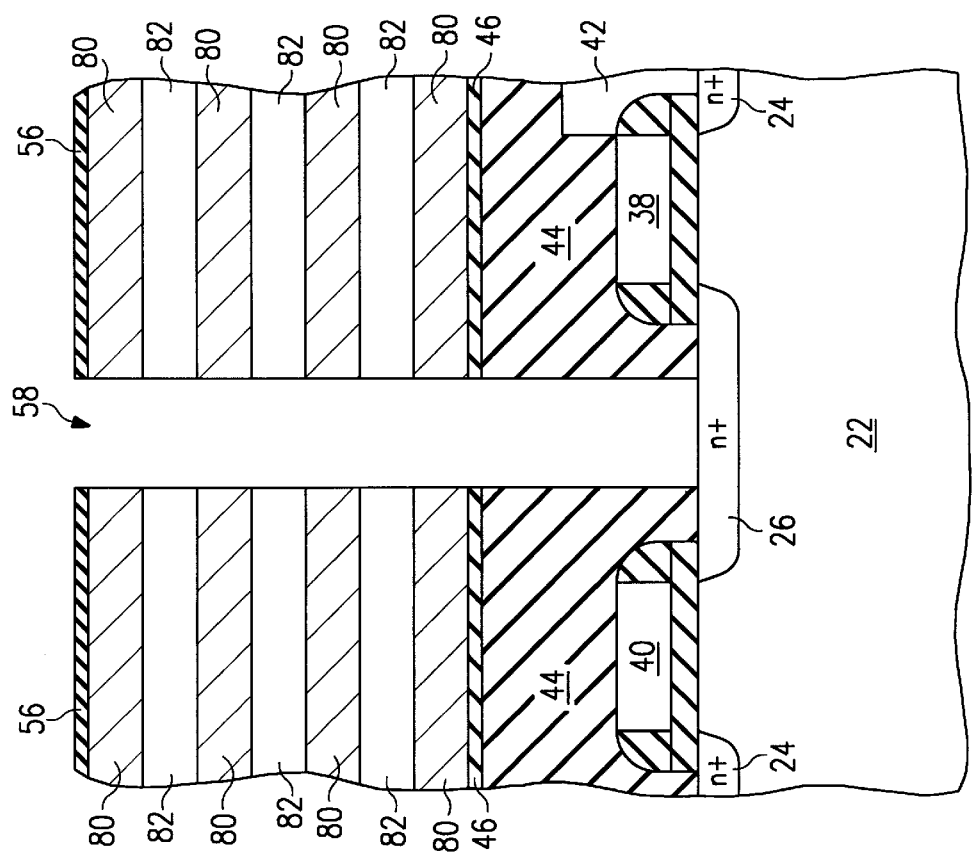
FIG. 5 is a schematic drawing in section with portions broken away of a portion of a DRAM memory cell during processing showing the fabrication of the lower storage node after further etching of the alternating layers.

As shown in FIG. 5, after the creation of void region 58, a selective etch is performed to etch the first material layers 80 selectively with respect to the second material layers 82. The first material layers 80 are etched radially to undercut the first material layers 80 from the second material layers 82, as shown in FIG. 5. Although shown with first material layers 80 undercutting the second material layers 82, it will be apparent to those skilled in the art that the etch selectivities could be selected such that second material layer 82 undercuts first material layer 80 without departing from the teachings of the present invention.

Additionally, although the alternating layers are shown to include one more layer of first material 30 then second material 82, the alternating layers could include an equal number of layers of the first and second materials. The etch may be either a wet etch or a dry etch, and the etch chemistry and type may vary depending on the composition of the first and second materials. For example, if TEOS and 11% PSG are used, respectively, a vapor HF etch with less than 1/% unbuffered HF may be used for a duration on the order of 35 to 40 seconds. The duration of the etch is determined by the extent of the undercut desired. Other appropriate etches, such as an appropriate plasma etch, will be apparent to those of ordinary skill in the art having reference to the specification.

After the selective etching of the alternating layers, the corrugated post storage electrode 30 is formed through selective silicon deposition of doped silicon, which may be doped polysilicon, in void region 58. Selective silicon deposition allows the growth of silicon only upon silicon and not upon the oxide or nitride layers and is well known in the art. The chemical reactions associated with the use of dichlorosiliane for selective silicon deposition is given below.

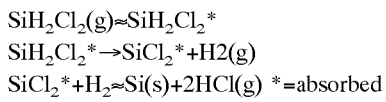

For these particular chemical reactions, additional HCl may be added to eliminate nuclei on the dielectric or masking layer surfaces.

Figure 6:
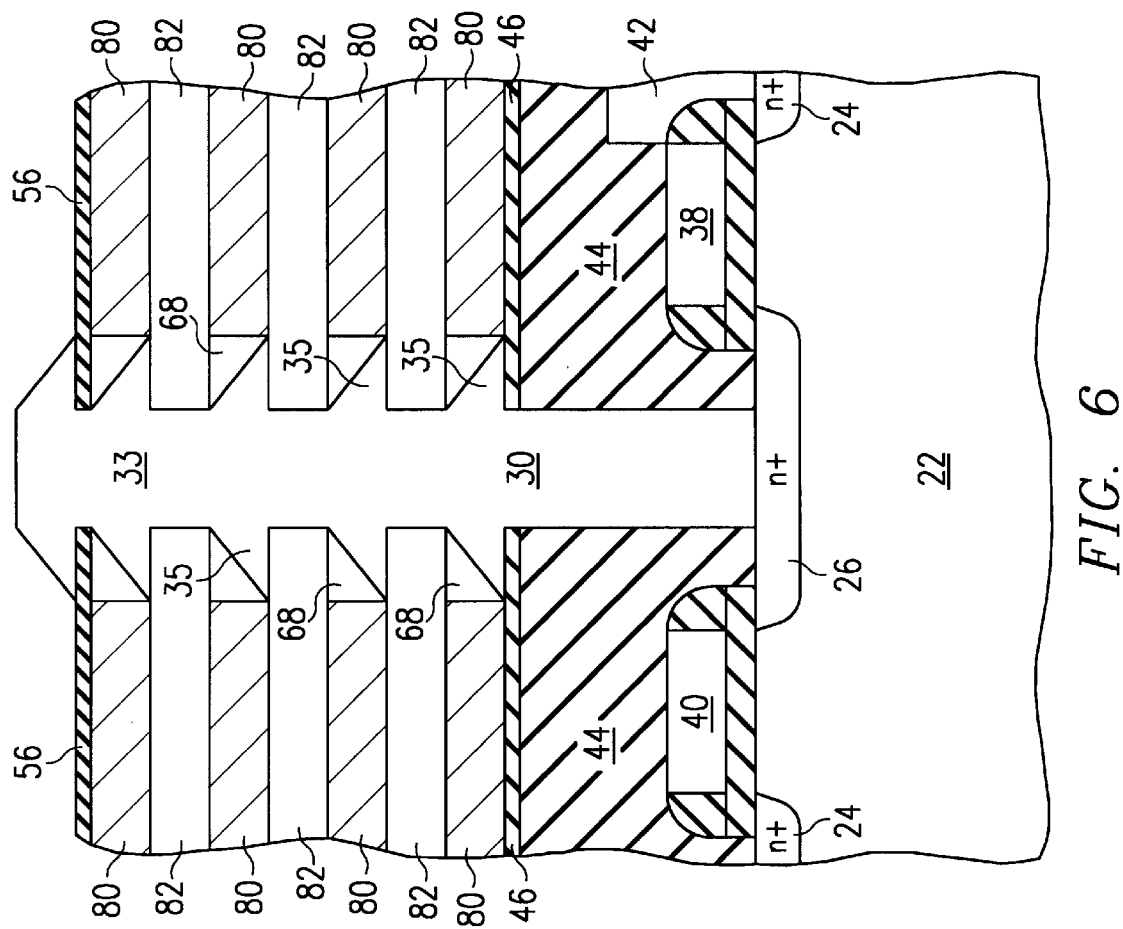
FIG. 6 is a schematic drawing in section with portions broken away of the corrugated post storage capacitor during fabrication after selective deposition of silicon.

Doped polysilicon may be deposited in void region 58 through selective silicon deposition. Additionally, by overgrowing the silicon over each first layer 80 into the undercut areas, a capped portion 35 of storage electrode 30 is formed as shown in FIGS. 6 and 7. Overgrowing the silicon on top of the alternating layers and into the undercut areas creates a corrugated post section 33, which provide an increased surface area for storage electrode 30. Areas 68 are void regions where silicon does not form. The doped polysilicon is preferably doped with a doping level somewhere in the region of $1-5\times10^{20}$ atoms/cm$^3$ of phosphorous, although other doping levels and dopants may be employed. The increased contact area between the corrugated post storage electrode 30 and the dielectric 48 provides increased storage capacity of storage capacitor 52, thereby increasing the memory capacity of each memory cell 20. Therefore, larger memory capacity DRAMS may be constructed without increasing their physical size.

Figure 7B:
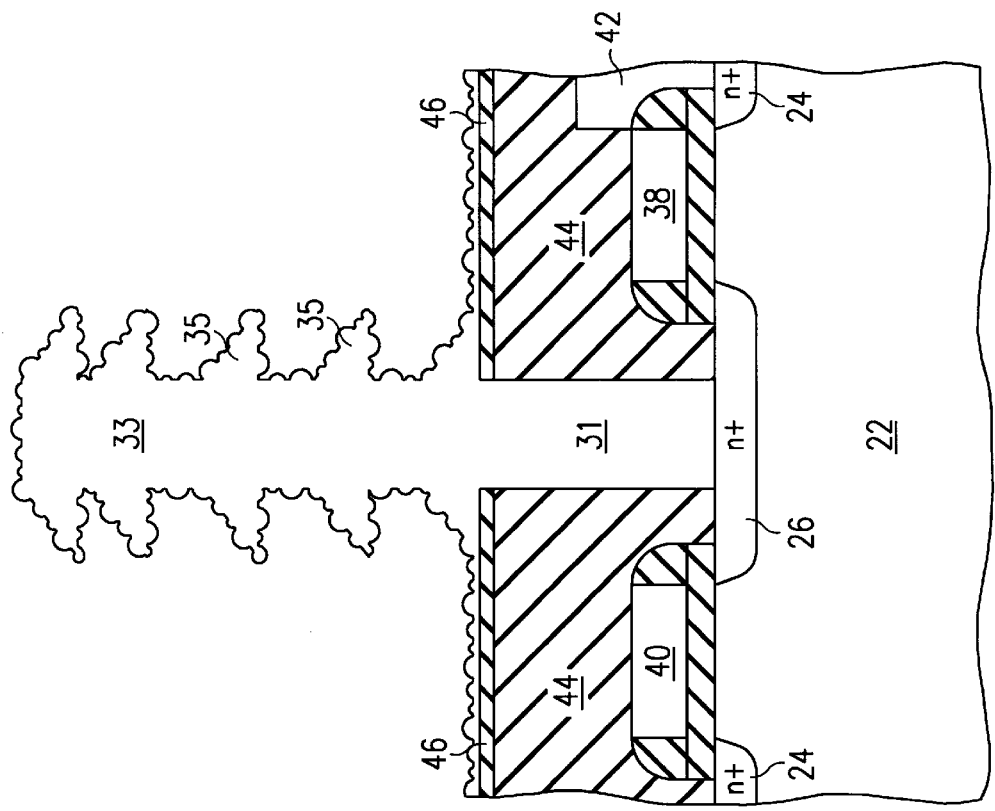
FIG. 7B is a schematic drawing in section with portions broken away of a corrugated post storage capacitor during fabrication, after removal of the alternating layers of doped and undoped material and after application of a layer of rugged polysilicon.
Figure 7A:
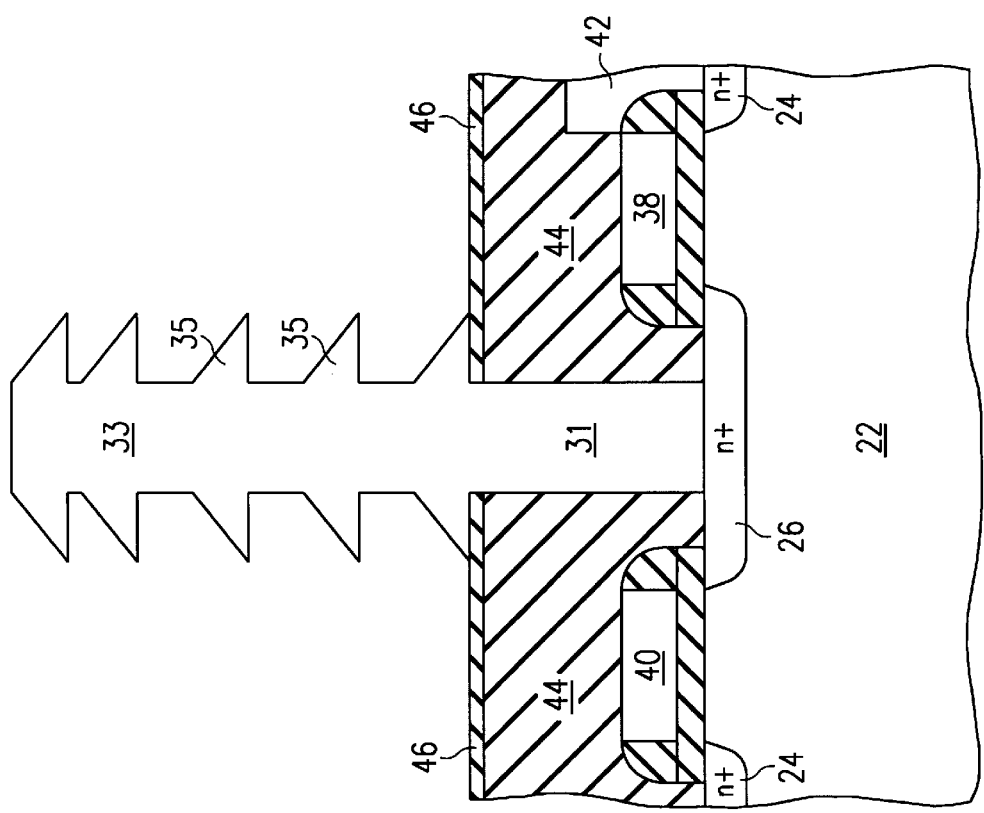
FIG. 7A is a schematic drawing in section with portions broken away of a corrugated post storage capacitor during fabrication, after removal of the alternating layers of doped and undoped material.

After formation of corrugated post storage electrode 30, the masking layer 56 and alternating layers of first and second materials 80 and 82 and are etched, leaving the corrugated post storage electrode shown in FIG. 7. At this point, a thin layer of rugged polysilicon may be deposited and anisotropically etched to leave a textured surface on the corrugated post storage electrode 30 and over the insulating layer 46 (FIG. 7b). The rugged polysilicon may then be anisotropically etched to leave the textured surface on the corrugated post storage electrode, as shown in FIG. 9. The rugged polysilicon allows for further surface area enhancement.

Methods for depositing rugged polysilicon to further enhance the surface area are well known in the art. At certain temperatures and pressures, deposition of polysilicon forms nodules on the surface and as arriving silicon atoms reach the surface, they migrate across the surface to form one of the nodules forming what is called rugged polysilicon or hemispherical grain polysilicon. This is in contrast to a smooth continuous film which is provided with standard polysilicon. Rugged polysilicon is known to produce a surface area of approximately 2.2 times that of smooth silicon.

The corrugated post storage capacitor 21 is completed by forming a capacitor dielectric over the corrugated post storage electrode 30, and by formation of a layer 50 of silicon to form the second electrode of the corrugated post storage capacitor 21. The second node 50 of the corrugated post storage capacitor 21 preferably comprises doped polysilicon. The completed corrugated post storage capacitor is shown in FIG. 8. A coupled corrugated post storage capacitor with a layer of rugged polysilicon is shown in FIG. 9.

Although the present invention has been described in detail, it should be understood that various modifications, alterations, and substitutions can be made to this description without departing from the intended scope of the present invention as defined by the appended claims.

What is claimed is:

1. A method for forming a dynamic random access memory cell having a storage capacitor on a substrate comprising the steps of:
   depositing a first film having a first etch selectivity;
   depositing on the first film a second film having a second etch selectivity;
   repeating at least one time the steps of depositing the first film and depositing the second film to form a plurality of first film layers alternated with a plurality of second film layers;
   etching a void in the pluralities of first and second film layers;
   selectively etching the plurality of first and second film layers to form a plurality of undercut areas;
   selectively depositing silicon in the void;
   overgrowing the selectively deposited silicon to fill a portion of the undercut areas;
   removing the pluralities of first and second film layers;
   forming a capacitor dielectric over the selectively deposited silicon; and
   depositing a conductive material over the dielectric.

2. The method of claim 1 further comprising the steps of depositing an insulating layer and a masking layer on the substrate prior to deposition of the first film and etching a void in the masking layer and insulating layer.

3. A method of claim 1 wherein the selectively deposited silicon is a doped polysilicon in a range of $1\times10^{20}$ atoms per cm$^3$ to $5\times10^{20}$ atoms/cm$^3$ of phosphorous.

4. The method of claim 1 wherein the first film comprises tetraethoxysilane.

5. The method of claim 1 wherein the second film comprises phosphosilicate glass.

6. The method of claim 1 wherein the second film comprises SACVD oxide.

7. The method of claim 1 further comprising the step of depositing a layer of rugged polysilicon over the selectively deposited silicon prior to depositing the conductive material over the capacitor dielectric.

8. A method of forming a capacitor for a semiconductor device having a substrate, comprising the steps of:

forming on the substrate an insulating layer;

providing a mask layer over the insulating layer;

depositing a plurality of alternating layers of first and second materials on the mask layer, the first and second materials having different etch selectivities in a ratio of at least 20:1;

patterning the plurality of alternating layers to expose a first area;

anisotropically etching the plurality of alternating layers beneath the first area to create a first void region and to expose the masking layer;

patterning the masking layer and the insulating layer to expose a second area;

anisotropically etching the insulating layer beneath the second area to create a second void region and expose the substrate;

selectively and radially etching the plurality of alternating layers to form a plurality of undercut areas;

selectively depositing silicon in the first and second void regions in the undercut areas;

selectively removing the plurality of alternating layers;

forming a dielectric layer over the selectively deposited silicon; and forming a conductive material over the dielectric layer.

9. The method of claim 8 wherein the first material comprises tetraethoxysilane.

10. The method of claim 8 wherein the second material comprises phosphosilicate glass.

11. The method of claim 8 wherein the second material comprises SACVD oxide.

12. The method of claim 8 wherein the masking layer comprises nitride.

13. The method of claim 8 further comprising the step of forming a layer of rugged polysilicon over the selectively deposited silicon.

14. The method of claim 8 wherein the step of selectively depositing silicon comprises the step of selectively depositing doped polysilicon in the range $1–5\times10^{20}$ atoms/cm$^3$ of phosphorous.

* * * * *